US005412854A

United States Patent [19]

Lockwood et al.

[11] Patent Number: 5,412,854

[45] Date of Patent: May 9, 1995

[54] METHOD OF MAKING A HIGH FREQUENCY FOCUSED TRANSDUCER

[75] Inventors: Geoff R. Lockwood; Daniel H. Turnbull, both of North York; F. Stuart Foster, Toronto, all of Canada

[73] Assignees: Humphrey Instruments, Inc., San Leandro, Calif.; Sunnybrook Health Science Centre, North York

[21] Appl. No.: 77,865

[22] Filed: Jun. 18, 1993

[51] Int. Cl.$^6$ .............................................. H01L 41/22

[52] U.S. Cl. .................................................... 29/25.35

[58] Field of Search ...................... 29/25.35, 600, 738, 29/DIG. 1, DIG. 29; 156/261, 264; 264/22; 310/334, 363, 364, 358, 369

[56] References Cited

U.S. PATENT DOCUMENTS

| | | | |
|---|---|---|---|
| 2,420,864 | 5/1947 | Chilowsky | 29/25.35 |
| 2,803,129 | 8/1957 | Bradfield | 29/25.35 X |
| 3,054,084 | 9/1962 | Parssinen et al. | 29/25.35 X |
| 3,242,552 | 3/1966 | Cowan | 29/25.35 |
| 3,448,503 | 6/1969 | Trott et al. | 29/25.35 |
| 3,495,617 | 2/1970 | Cook et al. | 29/25.35 |
| 3,666,979 | 5/1972 | McElroy | 29/25.35 X |
| 3,943,387 | 3/1976 | Veith | 310/358 |
| 4,021,922 | 5/1977 | Goldberg . | |
| 4,030,175 | 6/1977 | McShane | 29/25.35 |
| 4,227,111 | 10/1980 | Cross et al. | 310/358 |
| 4,283,178 | 8/1981 | Tetzlaff . | |
| 4,385,255 | 5/1983 | Yamaguchi et al. | 29/25.35 X |
| 4,403,382 | 9/1983 | Facoetti et al. | 264/22 X |
| 4,514,247 | 4/1985 | Zola | 156/264 X |
| 4,530,139 | 7/1985 | Miller | 29/25.35 |
| 4,564,980 | 1/1986 | Diepers | 156/264 X |
| 4,611,372 | 9/1986 | Enjoji et al. | 310/369 X |
| 4,617,707 | 10/1986 | Mohaupt et al. | 310/369 X |
| 4,783,888 | 11/1988 | Fujii et al. | 310/334 X |
| 4,803,763 | 2/1989 | Eturo et al. | 29/25.35 |
| 4,869,768 | 9/1989 | Zola | 29/25.35 X |
| 4,876,776 | 10/1989 | Whatmore et al. | 29/25.35 |
| 4,992,692 | 2/1991 | Dias | 310/369 X |
| 5,191,687 | 3/1993 | Dam et al. | 29/25.35 |

FOREIGN PATENT DOCUMENTS

| | | | |
|---|---|---|---|
| 21823 | 2/1977 | Japan | 29/25.35 |
| 7211 | 1/1984 | Japan | 29/25.35 |
| 9218256 | 10/1992 | WIPO | 29/25.35 |

OTHER PUBLICATIONS

"Flexible Composite Transducers" Skinner et al, Mat. Res. Bull., vol. 13, No. 6, Perganon Press Inc., Jun. 1978, pp. 599–607.

Patent Abstracts of Japan, vol. 9, No. 279, Nov. 7, 1984, 60 122 175.

*Primary Examiner*—Peter Dungba Vo

[57] ABSTRACT

A high frequency focused transducer may be formed by fabricating a piezoelectric or ferroelectric wafer of a thickness less than about 100 microns and bonding a malleable sheet to the wafer with a thin layer of adhesive. Thereafter, the composite may be pressed into a spherical mold to form a curved transducer without fracturing the wafer. In another embodiment, a conductive adhesive layer may be applied to the wafer to a thickness sufficient to hold the wafer in a curved state, when set. After the adhesive is set, the composite may be pressed into the mold while the adhesive is held at an elevated temperature whereat it is elastic. Thereafter the composite is cooled so that the adhesive layer is stabilized and the curved transducer is removed from the well.

14 Claims, 2 Drawing Sheets

METHOD OF MAKING A HIGH FREQUENCY FOCUSED TRANSDUCER

BACKGROUND OF THE INVENTION

1. Field of the Invention

This invention relates to a method of making a high frequency focused transducer.

2. Description of the Related Art

Ultrasound imaging is now well established as an important medical diagnostic tool. This method relies on a device called a transducer to create a train of ultrasound pulses, in the frequency range from 2 to 10 MHz, that are radiated into the body. Echoes returned from the tissues being imaged are detected by the same transducer and transformed into electrical signals which can be displayed on a monitor. Image quality is primarily determined by the ability of the transducer to focus the ultrasound energy while the sensitivity of the imaging system is determined by the piezoelectric properties of the material that is used in the transducer. The ultrasound transducer therefore plays a critical role in determining the performance of an imaging system. Current state of the art single element transducers utilize spherically curved radiators which are machined from a ceramic material such as Lead Zirconate Titanate (PZT) or from a ceramic-polymer composite. PZT is usually the material of choice for clinical transducers because of its high efficiency and excellent electrical characteristics.

Recently, a number of new ultrasound imaging systems have been developed for visualization of the eye, skin, endoluminal structures and intravascular structures at frequencies greater than 20 MHz. Unfortunately, at higher frequencies ceramic transducers are difficult to fabricate. In particular, obtaining a high frequency focused transducer is difficult since the thickness of the transducer material, being less than about one hundred microns, is too small for accurate machining of the ceramic into a spherically shaped disk. Electronic focusing using an array of elements is also difficult due to the prohibitively small element to element spacing that is required. In light of these problems, many high frequency imaging systems employ a planar ultrasound transducer and either leave the beam unfocused or weakly focus the beam using a spherical reflector (mirror), both of which degrade the lateral resolution of the system.

A method of fabricating spherically shaped 50–100 MHz transducers using a piezoelectric polymer material (Poly(Vinylidene Fluoride)) is known. The flexibility of this polymer allows the fabrication of spherically focused high frequency ultrasound transducers by deforming the material about a spherical object. Unfortunately, higher losses, and a lower electromechanical coupling coefficient make this type of transducer approximately four to ten times less efficient than a ceramic transducer. Polymer transducers are also characterized by a low dielectric constant which make it difficult to efficiently couple electrical energy to and from the transducer when the area of the transducer is small. In spite of these disadvantages, their ease of fabrication in spherical geometries have made polymer transducers dominant in applications at frequencies above 40 MHz.

This invention seeks to overcome drawbacks of known prior art high frequency focused transducers.

SUMMARY OF THE INVENTION

According to the present invention, there is provided a method of fabricating a wafer assembly for a high frequency focused transducer comprising the following steps: fabricating a piezoelectric or ferroelectric wafer of a thickness of less than about one hundred microns, said thickness chosen to provide resonance at a desired high frequency of greater than 20 MHz; adhesively bonding a conductive malleable sheet over a back face of said wafer whereby said adhesive stabilises said wafer, said malleable sheet being chosen to have sufficient strength to hold said wafer in a curved state; pressing said wafer with said malleable sheet into a mold in order to form a curve in said wafer and said malleable sheet.

In accordance with a further embodiment of the present invention, there is provided a method of fabricating a wafer assembly for a high frequency focused transducer comprising the following steps: fabricating a piezoelectric or ferroelectric wafer of a thickness of less than about one hundred microns, said thickness chosen to provide resonance at a desired high frequency of greater than 20 MHz; applying a conductive adhesive layer over back face of said wafer comprised of an adhesive of the type which, when set, is elastic over a first range of temperatures and is stable over a second lower range of temperatures, said second range of temperature including the temperatures at which said transducer will operate, said conductive adhesive layer being applied to thickness of about one hundred microns such that said adhesive layer is sufficient to hold said wafer in a curved state, when said adhesive layer is set; while said adhesive is within said first range of temperatures, pressing said wafer with said conductive adhesive layer into a mold in order to form a curve in said wafer; and cooling said wafer with said conductive adhesive layer to said second range of temperatures.

BRIEF DESCRIPTION OF THE DRAWINGS

In the figures which disclose example embodiments of the invention.

DESCRIPTION OF THE PREFERRED EMBODIMENTS

Figure 1:
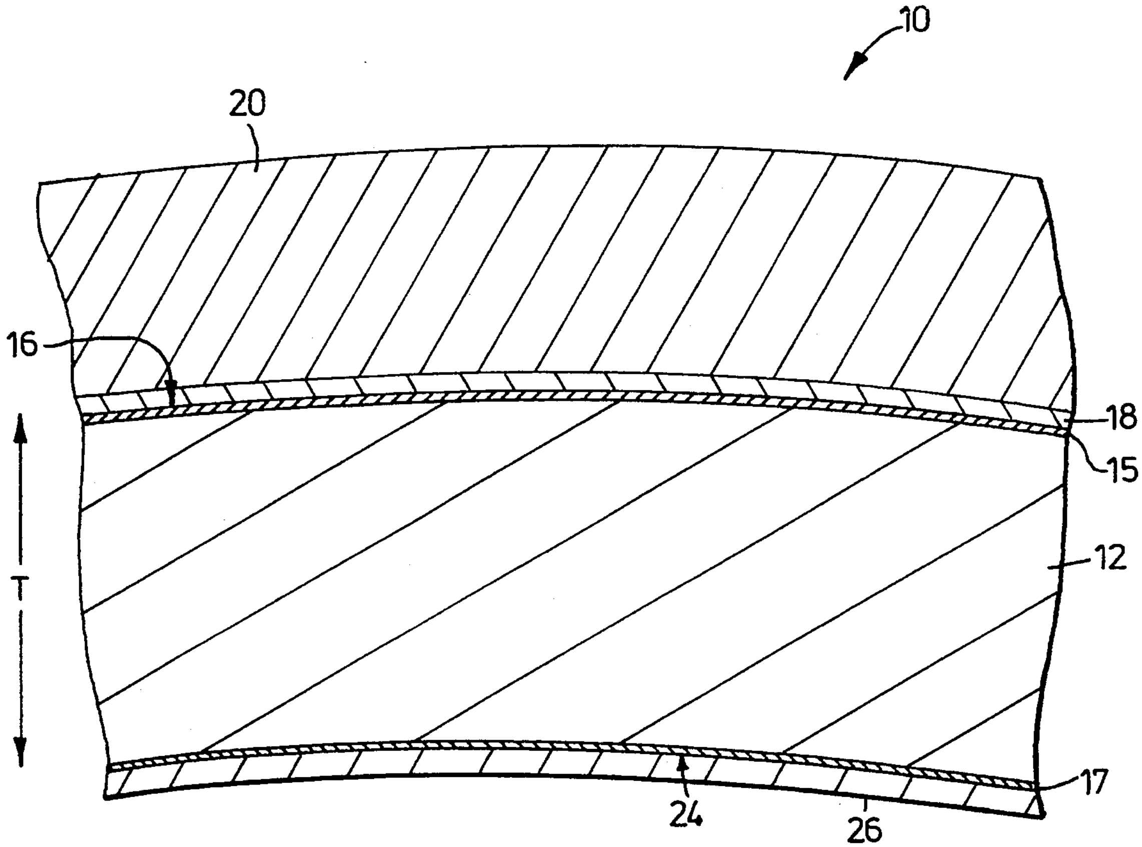
FIG. 1 is an enlarged schematic cross-sectional side view of a portion of a transducer made in accordance with one embodiment of this invention, FIG. 2 an enlarged schematic cross-sectional side view of a portion of a transducer made in accordance with another embodiment of this invention.

With reference to FIG. 1, a transducer 10 made in accordance with this invention comprises a wafer 12 having a thickness T of less than about one hundred microns. The wafer is fabricated of a piezoelectric or ferroelectric material, such as lithium niobate or lead zirconate titanate (PZT) and has a thin electrode layer 15, 17 deposited on its back 16 and front 24 faces, respectively. The electrode layers may be about one thousand Angstroms thick. A thin adhesive layer 18 of a few microns in thickness is applied over the back face 16 of the wafer 12. A conductive malleable sheet, namely, metal sheet 20 is bonded by the adhesive layer 18 to face 16.

As will be apparent from FIG. 1, the wafer 12 is curved along its surface 16. This curvature of the wafer is what focuses the transducer 10.

Wafers made of a piezoelectric or ferroelectric material are brittle and will normally fracture rather than deform under the influence of an applied force. The subject invention, however, allows a deforming force to be applied to the very thin wafer 12 without fracturing the wafer thus allowing the wafer to be curved so that it may be fabricated into a high frequency focused transducer.

The steps involved in the fabrication high frequency transducer 10 of this invention are as follows. A bulk sample of a piezoelectric or ferroelectric material is lapped to a wafer thickness corresponding to the desired resonant frequency. For example, for a fifty MHz PZT transducer, the thickness of the wafer should be approximately forty microns. The electrode layers 15, 17 are next deposited onto the wafer. A thin adhesive layer 18 is then applied to the back face 16 of the wafer. Where the wafer is made of a ceramic (typically PZT), the adhesive tends to penetrate the fissures between the grains. A metal sheet 20 is applied to the thin adhesive layer 18 and the adhesive is set to bond the metal layer 20 to the wafer 12. The composite may then be cut to its finished dimensions.

The composite wafer 12 with metal sheet 20 bonded thereto by the thin adhesive layer may be pressed into a mold comprising a well with a concave spherically shaped surface using a ball bearing. This spherically curves the wafer along face 16 in order to focus the transducer. By bonding the metal backing layer 20 onto the wafer, stresses which are created when the transducer is pressed into the well are evenly distributed across the surface of the material. Local concentrations of stress which lead to fracture are avoided so that the wafer may be curved without cracking. In addition, particularly where the wafer is ceramic, the penetration of the adhesive into the fissures of the wafer further stabilises the wafer to assist in avoiding cracking.

Because of the thinness of the adhesive layer 18, the metal backing layer 20 will make contact with the electrode layer 16 at a number of points when the composite is deformed in the mold. This ensures good electrical contact between the metal layer and the electrode layer. Optionally, the adhesive layer 18 may be comprised of a conductive adhesive which will provide uniform electrical contact between the electrode layer and the metal layer.

A wide range of adhesives are suitable for layer 18.

Figure 2:
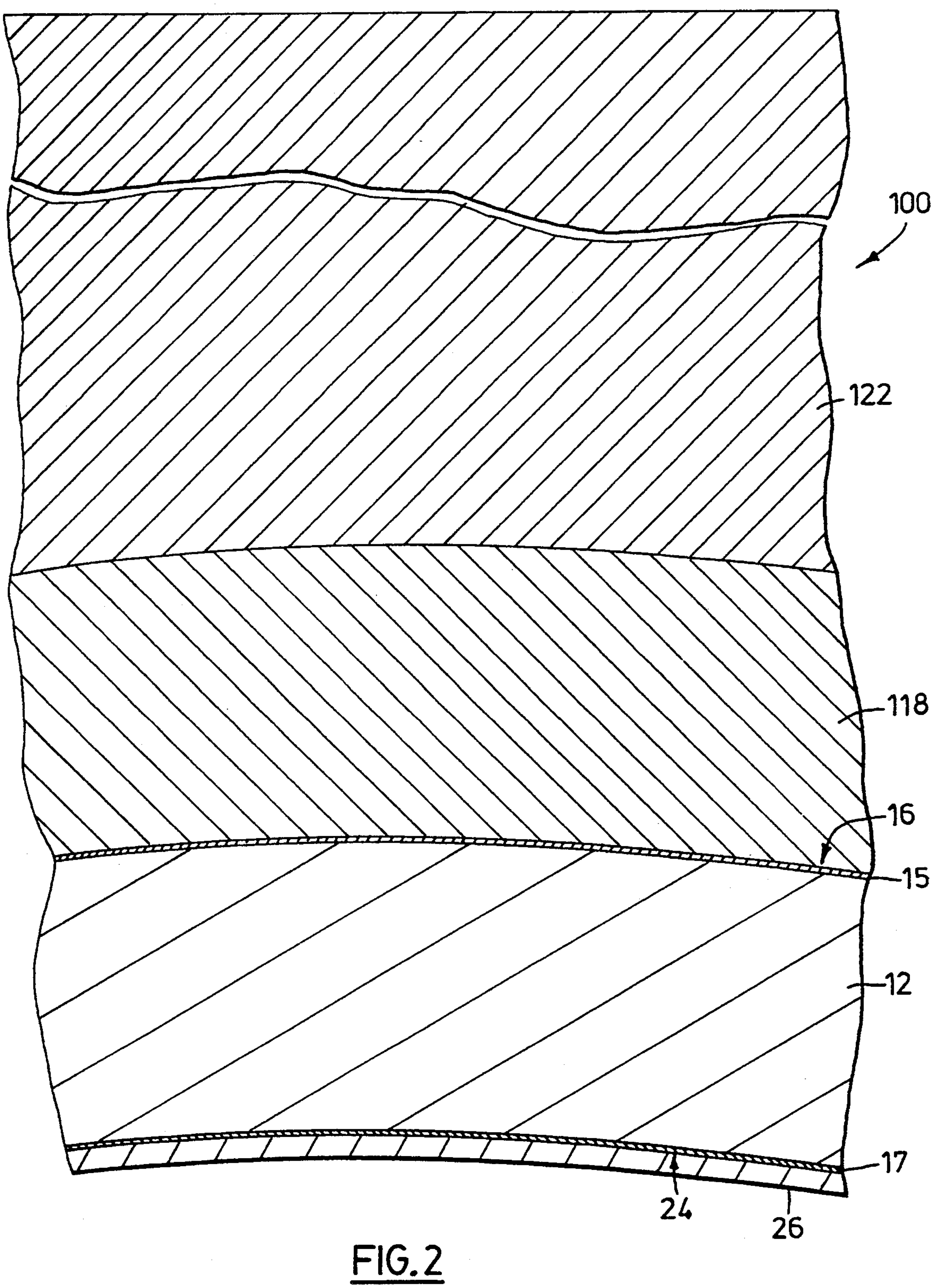

With reference to FIG. 2 wherein like reference numerals indicate like parts, a transducer 100 made in accordance with a second embodiment of the subject invention comprises a wafer 12 with a conductive adhesive layer 118 adhered to the electrode layer 15 of the back face 16 of the wafer. The conductive adhesive layer has a thickness of at least about one hundred microns which is sufficient to hold wafer 12 in a curved shape without the need for a malleable backing sheet. A thick conductive adhesive backing layer 122 of about one millimeter in thickness is cast onto the back of conductive adhesive layer 118. Wafer 12 is curved along its face 16.

The steps involved in fabricating transducer 100 are as follows. Firstly, as before, a piezoelectric or ferroelectric material is lapped to a wafer thickness corresponding to the desired resonant frequency and electrode layers 15, 17 are deposited on the front and back surfaces of the wafer. Conductive adhesive layer 118 of about one hundred microns in thickness is next applied over the back face 16 of the wafer 12 and set. The composite may then be cut to its finished dimensions.

The adhesive chosen for the conductive adhesive layer 118 must be one which is stable (i.e., not elastic) at the operating temperature range for the transducer 100 (normally room temperature) and which is elastic at an elevated temperature. By meeting these criteria an adhesive may be made to emulate a malleable material. An epoxy resin meets these criteria and is the preferred choice for the adhesive of this layer.

The composite wafer with adhesive layer is heated sufficiently so that the adhesive of layer 118 is elastic and the composite is then pressed in the mold. Stresses which are created when the transducer is pressed into the well are evenly distributed across the surface of the wafer by the adhesive layer 118. Once again, particularly where the wafer is ceramic, the penetration of the adhesive into the fissures of the wafer further stabilises the wafer to assist in avoiding cracking. After the composite wafer with adhesive layer has been deformed, the curved composite is cooled so that the adhesive is stabilised and the composite may then be removed from the mold. The stabilised adhesive layer 118 will retain the wafer in its curved shape provided it has a sufficient thickness. It has been found that a thickness of at least about one hundred microns for the adhesive layer is sufficient.

A relatively thick (one millimeter) adhesive backing layer 122 is next cast onto the back surface of the adhesive layer 118. The backing layer 122 provides a rigid support for the composite.

Figure 3:
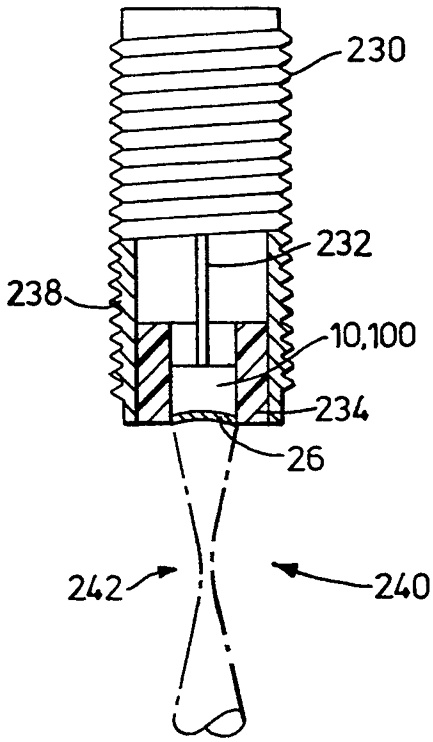
FIG. 3 is a partially cross-sectional side view of a transducer assembly incorporating a transducer made in accordance with this invention.

The curved wafer 12 with layers 18 and 20 (FIG. 1) or layers 118 and 122 (FIG. 2) may then be mounted in a barrel connector 230 shown in FIG. 3. Centre pin 232 of the barrel connector makes electrical contact with the conductive metal sheet 20 (FIG. 1) or conductive adhesive layer 118 (FIG. 2). A plastic insert 234 positions and holds the wafer 12 (FIG. 1 and 2) with its layers within the barrel connector 230. After assembly into the barrel connector 230, an conductive electrode layer 26 may be evaporated across the front face 24 (FIGS. 1 and 2) of the wafer 12, plastic insert 234, and housing 238 of the connector 230 in order to complete transducer 10 (of FIG. 1) or 100 (of FIG. 2). Housing 238 is made of a conducting metal so that an electrical potential may be applied between housing 238 and center pin 232 in order to apply a potential across the transducer. The resulting focused ultrasonic waves which emanate from the transducer 100 are indicated at 240 with the focus indicated at 242.

The high frequency transducer of FIG. 1 or 2 may be modified by additionally bonding a material 26 over the front surface 24 of the wafer 12.

The manufacturing technique of this invention is not effective for a low frequency transducer since, due to the thickness of the wafer, the adhesive will not sufficiently stabilise the wafer in order to allow it to be deformed in a mold. Those skilled in the art will realise that even with the technique of the present invention, there are limits to the amount the wafer may be curved. However, the invention permits sufficient curvature of a wafer to provide a focused transducer.

Other modification will be apparent to those skilled in the art and, accordingly, the invention is defined in the claims.

What is claimed is:

1. A method of fabricating a wafer assembly for a high frequency focused transducer comprising the following steps:

fabricating a piezoelectric or ferroelectric wafer of a thickness of less than about one hundred microns, said thickness chosen to provide resonance at a desired high frequency of greater than 20 MHz;

adhesively bonding a conductive malleable sheet over a back face of said wafer whereby said adhesive stabilises said wafer, said malleable sheet being chosen to have sufficient strength to hold said wafer in a curved state;

pressing said wafer with said malleable sheet into a mold in order to form a curve in said wafer and said malleable sheet.

2. The method of claim 1 including the step of removing said curved wafer with malleable sheet from said mold after said pressing step.

3. The method of claim 1 wherein the step of adhesively bonding a conductive malleable sheet to a back face of said wafer comprises bonding a malleable sheet to said back face of said wafer with an adhesive layer having a thickness of a few microns.

4. The method of claim 3 wherein the step of bonding a malleable sheet to said back face of said wafer with an adhesive layer comprises utilising a conductive adhesive for said adhesive layer.

5. The method of claim 3 including the step of applying an electrode over a front face of said wafer.

6. The method of claim 1 wherein said step of fabricating a piezoelectric or ferroelectric wafer comprises choosing a material for said wafer selected from the class of piezoelectric crystals and piezoelectric ceramics.

7. A method of fabricating a wafer assembly for a high frequency focused transducer comprising the following steps:

fabricating a piezoelectric or ferroelectric wafer of a thickness of less than about one hundred microns, said thickness chosen to provide resonance at a desired high frequency of greater than 20 MHz;

applying a conductive adhesive layer over a back face of said wafer comprised of an adhesive of the type which, when set, is elastic over a first range of temperatures and is stable over a second lower range of temperatures, said second range of temperatures including the temperatures at which said transducer will operate, said conductive adhesive layer being applied to a thickness of about one hundred microns such that said adhesive layer is sufficient to hold said wafer in a curved state, when said adhesive layer is set;

while said adhesive is within said first range of temperatures, pressing said wafer with said conductive adhesive layer into a mold in order to form a curve in said wafer; and cooling said wafer with said conductive adhesive layer to said second range of temperatures while said wafer with said conductive layer is pressed in said mold.

8. The method of claim 7 wherein said step of fabricating a piezoelectric or ferroelectric wafer comprises choosing a material for said wafer selected from the class of piezoelectric crystals and piezoelectric ceramics.

9. The method of claim 7 wherein the step of applying a conductive adhesive layer comprises applying a conductive epoxy resin.

10. The method of claim 7 including the step of removing said curved wafer with conductive adhesive layer from said mold after said cooling step.

11. The method of claim 10 including the step of applying an electrode over a front face of said wafer.

12. The method of claim 10 including the step of applying a backing conductive adhesive layer having a thickness of about one millimeter to said conductive adhesive layer after said step of removing said curved wafer with adhesive layer from said mold.

13. A method of fabricating a wafer assembly for a high frequency focused transducer comprising the following steps:

fabricating a piezoelectric or ferroelectric wafer to a thickness of less than one hundred microns from a material selected from the class of piezoelectric crystals and piezoelectric ceramics;

adhesively bonding a conductive malleable metal sheet over a back face of said wafer with an adhesive layer having a thickness of a few microns whereby said adhesive stabilises said wafer, said malleable metal sheet being chosen to have sufficient strength to hold said wafer in a curved state;

pressing said wafer with said malleable metal sheet into a well having a spherical surface in order to form a spherical curve in said wafer and said malleable metal sheet; and removing said curved wafer with malleable metal sheet from said well.

14. A method of fabricating a wafer assembly for a high frequency focused transducer comprising the following steps:

fabricating a piezoelectric or ferroelectric wafer to a thickness of less than one hundred microns from a material selected from the class of piezoelectric crystals and piezoelectric ceramics;

applying a conductive epoxy resin layer over a back face of said wafer such that said epoxy resin layer when set, is elastic over a first range of temperatures and is stable over a second lower range of temperatures, said second range of temperatures including the temperatures at which said transducer will operate, said conductive epoxy resin layer being applied to a thickness of about one hundred microns;

while said epoxy resin layer is within said first range of temperatures, pressing said wafer with said conductive epoxy resin layer into a well having a spherical surface in order to form a spherical curve in said wafer;

cooling said wafer with said conductive epoxy resin layer to said second range of temperatures; and removing said curved wafer with conductive epoxy resin layer from said well after said cooling step.

* * * * *